(12) United States Patent
Kamp et al.

(10) Patent No.: US 7,439,765 B2
(45) Date of Patent: Oct. 21, 2008

(54) MASK-PROGRAMMABLE LOGIC MACRO AND METHOD FOR PROGRAMMING A LOGIC MACRO

(75) Inventors: Winfried Kamp, München (DE); Siegmar Koeppe, München (DE); Michael Scheppler, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 103 days.

(21) Appl. No.: 11/437,435

(22) Filed: May 19, 2006

(65) Prior Publication Data

US 2006/0279329 A1    Dec. 14, 2006

(30) Foreign Application Priority Data

May 19, 2005    (DE)    ............ 10 2005 023 119

(51) Int. Cl.
*H03K 19/173*    (2006.01)
(52) U.S. Cl. ............................ 326/38; 326/41
(58) Field of Classification Search ........... 326/37–41, 326/47
See application file for complete search history.

(56) References Cited

U.S. PATENT DOCUMENTS

| | | | |
|---|---|---|---|
| 4,565,712 A | | 1/1986 | Noguchi et al. |
| 5,568,067 A | * | 10/1996 | McDermott et al. ............ 326/55 |
| 6,124,729 A | * | 9/2000 | Noble et al. .................. 326/41 |
| 6,160,420 A | * | 12/2000 | Gamal et al. .................. 326/41 |
| 6,285,218 B1 | | 9/2001 | Dhong et al. |
| 6,696,856 B1 | | 2/2004 | Smith et al. |

FOREIGN PATENT DOCUMENTS

| | | |
|---|---|---|
| DE | 311 5694 C2 | 8/1984 |
| DE | 314 8410 C2 | 10/1984 |
| EP | 0 573 175 A2 | 12/1993 |
| GB | 2 089 160 A | 6/1982 |

* cited by examiner

*Primary Examiner*—James H. Cho
(74) *Attorney, Agent, or Firm*—Maginot, Moore & Beck

(57) ABSTRACT

A mask-programmable logic macro includes at least three input terminals an output terminal and a first set of transistors comprised of at least three transistors formed on a semiconductor substrate, each of the transistors comprising a controllable path and a control terminal. The controllable paths can be connected in series with one another between a first supply terminal and the output terminal by metallizing first metallization regions. The the transistors of the first set of transistors are arranged on the semiconductor substrate in such a way that at least one controllable path of the transistors can be bridged by metallizing one of the first metallization regions. A respective of the input terminals can be connected to a respective of the control terminals by metallizing a second metallization region.

20 Claims, 9 Drawing Sheets

MASK-PROGRAMMABLE LOGIC MACRO AND METHOD FOR PROGRAMMING A LOGIC MACRO

BACKGROUND OF THE INVENTION

The present invention relates to a mask-programmable logic macro and a method for programming a logic macro.

The design of digital electronic circuits is characterized nowadays by a continual increase in the circuit complexity, a continuous drive toward miniaturization and severe time and cost pressure for the circuit users and manufacturers. In order to be able to react rapidly in the event of changing requirements made of digital circuits, so-called FPGA (field programmable gate arrays) have therefore been developed, which represent logic circuits which can be programmed by the user himself. FPGA have an array arrangement of programmable logic macros which can each perform logic functions. A complex logic chip with logic functions is then achieved by programming connections or the interconnection of the logic macros with one another.

The individual logic macros or logic cells are based essentially on arrangements of look-up tables which realize a Boolean function. A look-up table having N inputs should thus be able to realize $2^{2^N}$ Boolean functions. In the case of three input signals, these are for example 256 possible Boolean functions. The flexibility of FPGA architectures by virtue of programmability that is possible "in the field" requires a complicated area-intensive connection system, configuration memory elements and an extensive wiring. As a result of which FPGA components have comparatively slow processing times and are additionally expensive to develop and procure.

So-called application specific integrated circuits (ASICs) represent a compromise between comparatively easy adaptability of their logic functions and high processing speed. ASICs that may be mentioned are in particular gate arrays containing a regular arrangement of digital basic elements which can be combined with one another by interconnections in the production process.

Structured ASICs are partly prefabricated and predefined electronic circuits which are converted into application specific logic circuits during the fabrication process by specially adapted masking steps, by way of example. The production process usually involves process-technologically setting switches for the definition of the signal paths within the ASIC, such as for example by vias or applied metal connections.

U.S. Pat. No. 6,285,218 B1 describes for example a method for producing programmable logic cell arrays in which logic cells are formed by means of standardized masks. What is disadvantageous in this case is primarily the fact that in production for forming an individual logic cell of this type, it is necessary to use a plurality of different masks for the required standard elements. Moreover, only a limited number of Boolean functions can be realized by means of the logic elements of U.S. Pat. No. 6,285,218 B1.

A logic macro that can be used flexibly should be able, however, to realize all possible Boolean functions given a predetermined number of input signals, that is to say $2^{2^N}$ Boolean functions given N input signals. German patent 3148410 C2 discloses a programmable logic cell having three inputs, transistors connected in series essentially being arranged such that they are connected up in programmable fashion between a supply voltage and an output. Input signals are passed in each case to the control terminals of the transistors. A desired Boolean function is obtained by virtue of the fact that the controllable paths of the transistors can be bridged by further transistors in programmable fashion. The logic circuit in accordance with German patent 3148410 C2 also has the disadvantage that only a limited number of Boolean functions can be realized. Moreover, the programmability "in the field" requires a high outlay on circuitry which is manifested in a complicated production method comprising many processing steps. Consequently, the prior art also does not include any logic macros which can be adapted flexibly by a small number of programming steps specified in the production process.

There is a need, therefore, for a programmable logic device that addresses the shortcomings of the prior art.

BRIEF SUMMARY OF THE INVENTION

Embodiments of the present invention address one or more of the above stated needs.

A mask-programmable logic macro includes at least three input terminals an output terminal and a first set of transistors comprised of at least three transistors formed on a semiconductor substrate, each of the transistors comprising a controllable path and a control terminal. The controllable paths can be connected in series with one another between a first supply terminal and the output terminal by metallizing first metallization regions. The the transistors of the first set of transistors are arranged on the semiconductor substrate in such a way that at least one controllable path of the transistors can be bridged by metallizing one of the first metallization regions. A respective of the input terminals can be connected to a respective of the control terminals by metallizing a second metallization region.

The above described features and advantages, as well as others, will become more readily apparent to those of ordinary skill in the art by reference to the following detailed description and accompanying drawings.

DETAILED DESCRIPTION OF THE INVENTION

In the figures, unless specified otherwise, identical or functionally identical elements have been provided with the same reference symbols.

A mask-programmable logic macro includes at least three input terminals an output terminal and a first set of transistors comprised of at least three transistors formed on a semiconductor substrate, each of the transistors comprising a controllable path and a control terminal. The controllable paths can be connected in series with one another between a first supply terminal and the output terminal by metallizing first metallization regions. The the transistors of the first set of transistors are arranged on the semiconductor substrate in such a way that at least one controllable path of the transistors can be bridged by metallizing one of the first metallization regions. A respective of the input terminals can be connected to a respective of the control terminals by metallizing a second metallization region.

According to a first embodiment of the invention, a mask-programmable logic macro comprises at least three input terminals and an output terminal, at least three transistors—formed on a semiconductor substrate—of a first set of transistors each comprising a controllable path and a controllable terminal. In this case, the controllable paths can be connected in series with one another between a supply terminal and the output terminal by metallizing first metallization regions. Furthermore, the transistors are arranged according to the invention on the semiconductor substrate in such a way that at least one controllable path can be bridged by metallizing a first metallization region and a respective input terminal can be connected to a respective controllable terminal by metallization of a second metallization region.

According to at least some embodiments, in principle any Boolean function can be represented by means of the mask-programmable logic macro. In this case, the transistors are arranged such that the three controllable paths can be connected in series with one another between the supply terminal and the output terminal provided that corresponding metallization regions connect the respective source and drain terminals to one another. As an alternative, individual controllable paths can be bridged by simple metallizing. As a result, it is possible to define the interconnection of the respective transistor chain for example by simple mask programming, that is to say definition of the metallization regions to be metallized. The input signals can then be connected to the respective gate terminals or control terminals of the transistors likewise by metallizing second metallization regions. According to the invention, therefore, the logic function of the logic macro can be defined by one programming mask and only one metallization step in the production method of said macro.

Advantageously, at least one further set of transistors may be provided which is connected in parallel with the transistors of the first set between the first supply terminal and the output terminal.

This gives rise to transistor chains connected in parallel, the input signals in each case being passed to the control terminals and the selection of the metallization of the first metallization regions defining whether controllable paths of transistors are bridged or are embodied in a manner connected in series with other controllable paths. In principle, the extension of the logic macro according to the invention with a plurality of sets of transistors results in a larger representation space for the realization of Boolean functions. That is to say that the more transistors are provided according to the invention, the more different Boolean functions can be defined in a mask-programmable manner.

At least one first complementary set of transistors may also be connected between a second supply terminal and the output terminal.

In one preferred embodiment of the inventive logic macro, four first sets each comprising three transistors and four second sets each having three complementary transistors are provided for realizing a Boolean function, the three signals present at the input terminals being subjected to the respective Boolean function and a function result being output as output signal. The preferred embodiment therefore makes it possible to represent all 256 Boolean functions for three input signals in a programmable manner. The selection of the desired Boolean functions to be programmed then prescribes the first and the second metallization regions which are to be metallized in a production process.

A respective transistor may have in plan view essentially a rectangular doped transistor region on the semiconductor substrate with—formed thereon—a strip-type source region, gate region and drain region. The source, gate and drain regions run essentially perpendicular to an output terminal strip formed on the semiconductor substrate. Furthermore, the source and/or drain regions of adjacent transistors can be connected to one another by the metallizing of the first metallization regions. This favorable geometrical arrangement enables a particularly small and simple embodiment of the metallization regions and hence a simple programming mask production.

In an advantageous manner, the source, gate and drain regions of a transistor set may be in each case arranged essentially on a straight line and can in each case be connected to one another by metallizing the first and/or second metallization regions. Consequently, it is possible, for example, for a controllable path of a transistor to be bridged in a simple manner by means of a respective source or drain region serving as connection web between two further source or drain regions adjacent to the transistor to be bridged.

In another embodiment, input terminal strips parallel to one another are provided essentially perpendicular to the gate regions. The gate terminals are then connected to the input terminal strips by metallizing the second metallization regions.

The input terminal strips and/or the output terminal strip and/or the source, gate and drain regions may have at least in part a metallic material or a material having metal. The gate regions advantageously have polysilicon. The transistors are advantageously formed as MOSFET transistors. Furthermore, the transistors may be arranged in matrix-type fashion in a transistor matrix.

Furthermore, the invention provides a method for programming a logic macro, in particular a logic macro according to the invention, comprising the method steps of:

a) providing a prefabricated logic macro having at least three transistors formed on a semiconductor substrate the transistors each having source, gate and drain regions arranged in such a way that a respective controllable path lying below a gate region can be bridged by a source or drain region by means of metallizing first metallization regions or at least one source region of a first transistor together with a drain region of a second transistor can be connected to one another by means of metallizing a first metallization region, and having at least one supply terminal strip and an output terminal strip;

b) metallizing first metallization regions on the semiconductor substrate by means of a programming mask in such a way that a respective first controllable path is either connected in series with a second controllable path or bridged by a respective source or drain region and at least one source region is connected to the supply terminal strip and at least one drain region is connected to the output terminal strip;

c) metallizing second metallization regions on the gate regions of the transistors; and d) forming at least three input terminal strips on the second metallization regions.

The programming or definition of the respective Boolean functions which is intended to be carried out on the input signals can be programmed according to the invention by means of a single mask which defines the metallization regions to be metallized. Therefore, according to the invention it is particularly easy for the logic macros to be connected together or formed jointly to form an overall logic chip that can be adapted in an application specific manner. By keeping prefabricated logic macros according to the invention, the production outlay and in particular the production costs for exposure masks are reduced considerably by comparison with the prior art. According to the invention, it is merely necessary to provide standard programming masks which implement the desired Boolean functions in the logic macro.

The supply terminal strip, the output terminal strip and the first metallized metallization regions may be formed in the same processing layer on the prefabricated logic macro. This measure additionally obviates a processing step in the production method of the logic macros since the supply terminal strips and the output terminal strip always have to be kept. According to the invention, this can therefore advantageously be combined in one programming mask. The transistors may suitably be produced in a CMOS process.

The above described embodiments will become more readily apparent in view of the ensuing description of the embodiments illustrated in the drawing figures.

FIG. 1 shows a basic circuit of the mask-programmable logic macro 1 according to the invention. A first, second and third PMOS transistor 2, 3, 4 each having a source, gate and drain terminal S, G, D are provided in this case. The source terminal S of the first PMOS transistor 2 is connected to a supply terminal 5 with the supply voltage potential VDD and drain terminal D of the third PMOS transistor 4 is connected to an output terminal 7 via a "switch" 6. The controllable paths or the respective source-drain paths of the transistors 2, 3 and 4 can be connected in series between the supply terminal 5 and the output terminal 7. In this case, switches 8, 9 are respectively illustrated between the drain terminal D of the first transistor 2 and the source terminal S of the second transistor 3 and between the drain terminal D of the second transistor 3 and the source terminal S of the third transistor 4, which switches either connect the respective source and drain terminals S, D of different transistors 2, 3, 4 or bridge the respective controllable path or source-drain path of a transistor 2, 3, 4 by means of bridging lines 10, 11, 12.

The switch position can be defined in a mask-programmable manner according to the invention by metallizing metallization regions. The logic macro 1 illustrated here is embodied on a semiconductor substrate, which is not illustrated here. Here and hereinafter switches, such as for example 6, 8, 9, are to be understood in such a way that one of the switch positions are defined in the production method by forming metallized metallization regions on the corresponding semiconductor substrate.

Furthermore, provision is made of input terminals 13, 14, 15 for coupling in respective input signals a, b, c and complementary input terminals 16, 17, 18 for coupling in respective complementary input signals a_n, b_n, c_n. The respective gate terminals G of the transistors 2, 3, 4 can be connected in each case to an input terminal 13, 14, 15 or complementary input terminals 16, 17, 18 via switches 19, 20, 21. In this case, the switchability is once again understood as connection between a respective gate terminal G and the input terminal 13, 14, 15 or complementary input terminals 16, 17, 18 by metallizing two metallization regions on the semiconductor substrate.

Figure 1A:
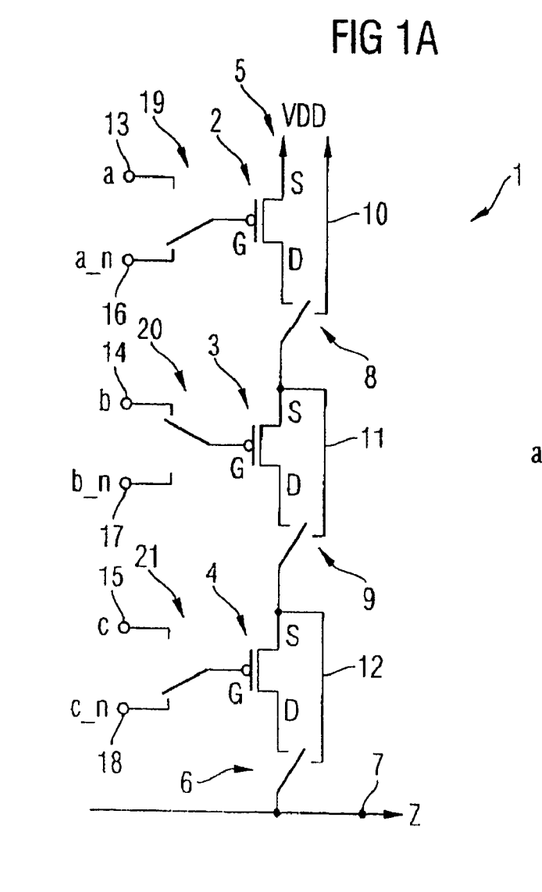
FIG. 1 is a basic form of an embodiment of an inventive logic macro.
Figure 1B:
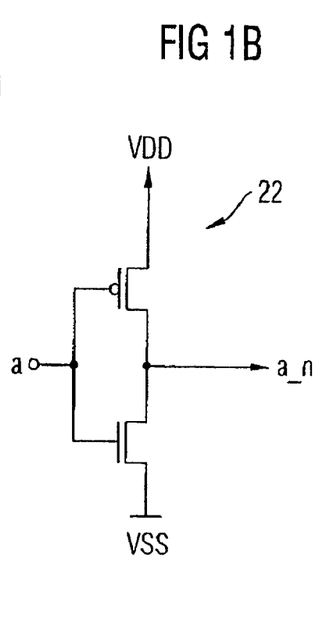

The respective complementary input signals a_n, b_n, c_n can be obtained from the input signals a, b, c by means of an inverter circuit 22, that is illustrated for example in FIG. 1B. A logic function or Boolean function of the logic macros is defined by the choice of the connections or by the switch settings of the switches 6, 8, 9, 19, 20, 21.

Figure 1C:
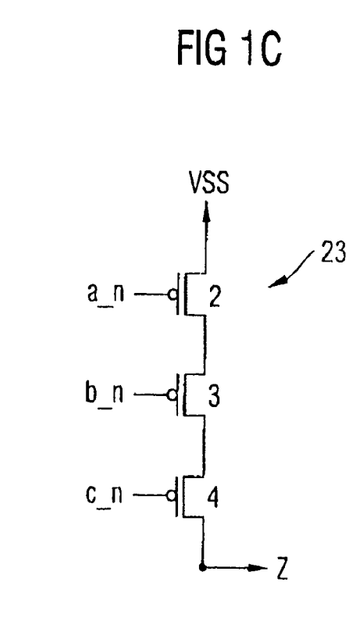

If a set of three transistors such as is illustrated in FIG. 1A is programmed or configured in accordance with FIG. 1C, a logic ANDing of the input signals a, b, c results. In this example of FIG. 1C, a first complementary or inverse input signal a_n is fed to the gate terminal or control terminal of the first transistor 2, an inverse second input signal b_n is fed to the gate terminal of the second transistor 3 and an inverse third input signal c_n is fed to the gate terminal of the fourth transistor. The controllable paths of the transistors are connected in series between the supply terminal and the output terminal. As already noted with respect to the switches in FIG. 1A, the corresponding connections are embodied by metallization of metallization regions provided according to the invention on the semiconductor substrate.

The mask-programmable logic macro 1 having three inputs or for processing three input signals a, b, c may have eight different ($2^3$) logic input states. In order to realize signal paths for all these possible input states, it would be necessary to provide eight differently programmed or configured logic macros 1 of this type in a logic macro. Investigations by the applicant reveal, however, that only three sets of transistors are required for realizing all the Boolean functions. Mathematically, it is possible to carry out a minimization, whereby permutations of the logic levels of input signals no longer have to be taken into account multiply by corresponding sets of transistors. The Boolean functions which require the most sets of transistors for realization are conjunction (AND) and non-equivalents (also called exclusive-OR) EXOR. An EXOR function can be realized for three input signals for example, with four transistor sets in accordance with the specification a·b_n·c_n+a_n·b·c_n+a_n·b_n·c+a·b·c. Further concr embodiments are explained in more detail below.

Figure 2A:
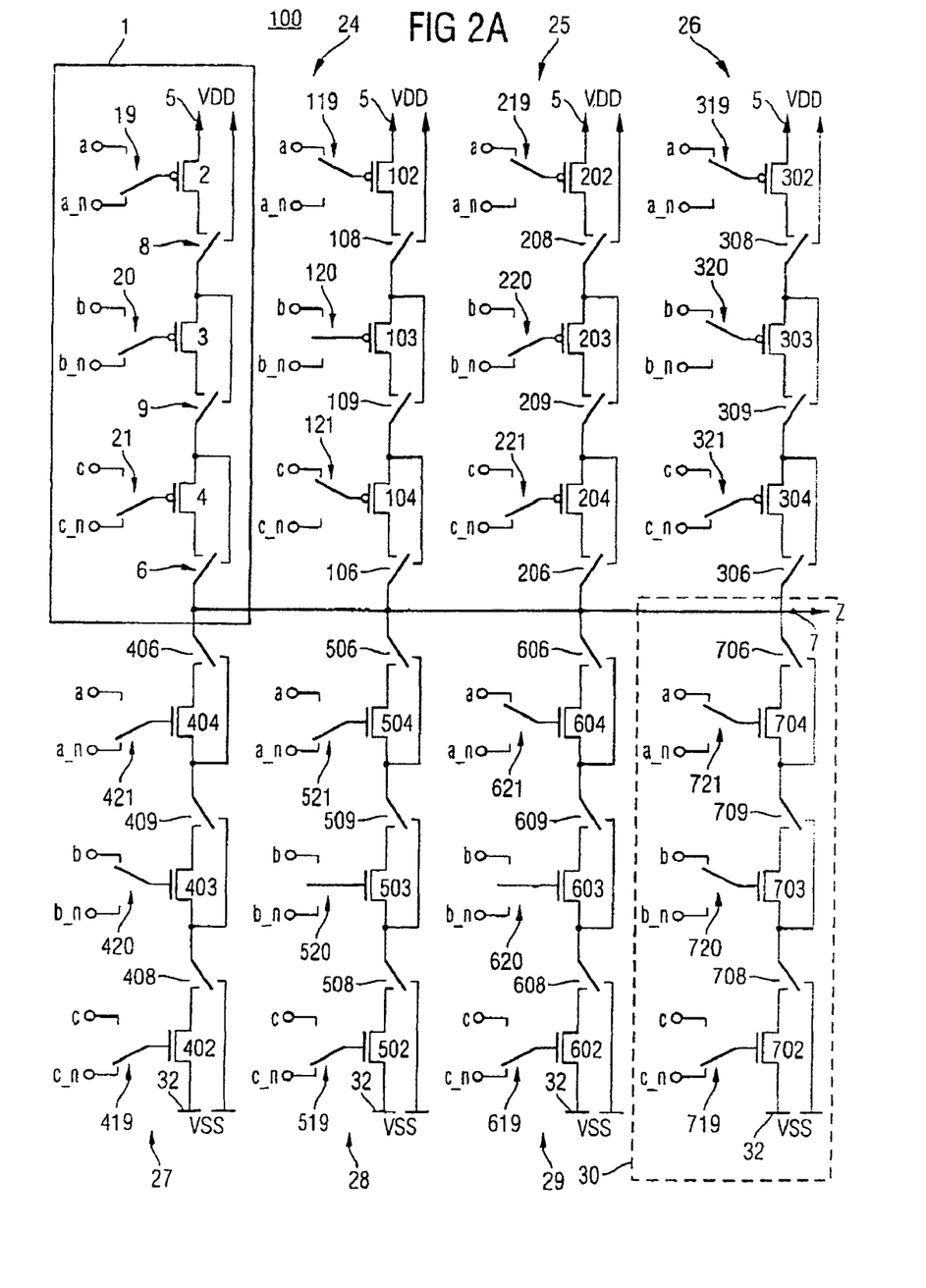
FIG. 2 is a circuit diagram of an exemplary embodiment of an inventive logic macro.

FIG. 2 illustrates a circuit diagram of an exemplary embodiment of the logic macro 100 according to the invention.

In order to be able to realize all possible 256 Boolean functions for three input signals or variables a, b, c with the logic macro 100, four sets 1, 24, 25, 26 of transistors are connected in parallel between supply terminals 5, which in each case supply a first supply voltage potential VDD, and an output line 31 leading to an output terminal 7.

The sets of transistors 1, 24, 25, 26 are in each case provided as explained in FIG. 1A. The first, second, third and fourth sets 1, 24, 25, 26 are constructed from PMOS transistors. A further four sets 27, 28, 29, 30 of complementary NMOS transistors are furthermore connected in parallel between the output line 31 and second supply terminals 32, which are in each case at a second supply voltage potential VSS.

By way of example, the first supply voltage potential VDD is used as a first logic level, high (1), and the second supply voltage potential VSS is used as a second logic level, low (0).

The numbering of the transistors of the second, third and fourth sets 24, 25, 26 corresponds to that of the first set 1, the first transistors of the second, third and fourth sets being numbered 102, 202 and 302, respectively. The corresponding switches or metallization regions are likewise designated by 108, 208, 308, etc.

The first, second, third and fourth complementary sets 27, 28, 29, 30 of transistors are essentially constructed like the first set 1. In this case, the source-drain paths of the first, second and third transistors 702, 703, 704 can be connected in series between the second supply terminal 33 and the output line 31 or the output terminal 7 via the switches 706, 708, 709. The controllable paths of the transistors 702, 703, 704 can be bridged depending on the configuration or position of the switches 706, 708, 709. Via switches 719, 720, 721, to the input signals a, b, c or the respective inverted input signals a_n, b_n, c_n can be coupled to the gate terminals of the transistors 702, 703, 704. The designation of the first, second and third transistors 402, 403, 404, 502, 503, 504, 602, 603, 604 of the first, second and third complementary sets 27, 28, 29 is in each case chosen analogously. The same applies to the switches or metallizable metallization regions 406, 408, 409, 419, 420, 421, 506, 508, 509, 519, 520, 521, 606, 608, 608, 609, 619, 620, 621.

Figure 2B:
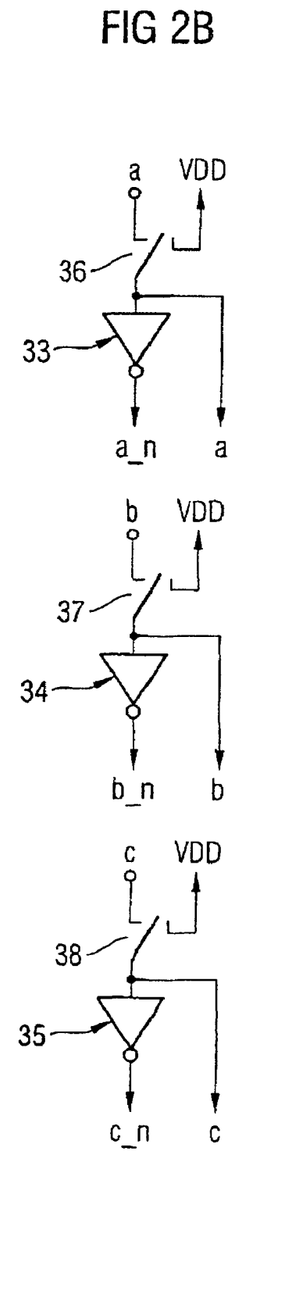

The respective inverted input signals a_n, b_n, c_n can be generated by inverter circuits as are illustrated in FIG. 2B. For this purpose, a first, second and third inverter 33, 34, 35 with a respective switch 36, 37, 38 connected upstream at the input is furthermore kept for the logic macro 100. A complementary or inverse input signal a_n, b_n, c_n can thus be tapped off at the output of a respective inverter 33, 34, 35 given a corresponding switch position. In an alternative switch position, which can in each case be produced once again by metallizing metallization regions, the second logic level is in each case output at the output of the inverters 33, 34, 35 as a result of feeding in the first supply voltage potential VDD or the first logic level.

By defining the switch positions, any logic function for three input variables can be realized by the logic macro 100 according to the invention.

Figure 3:
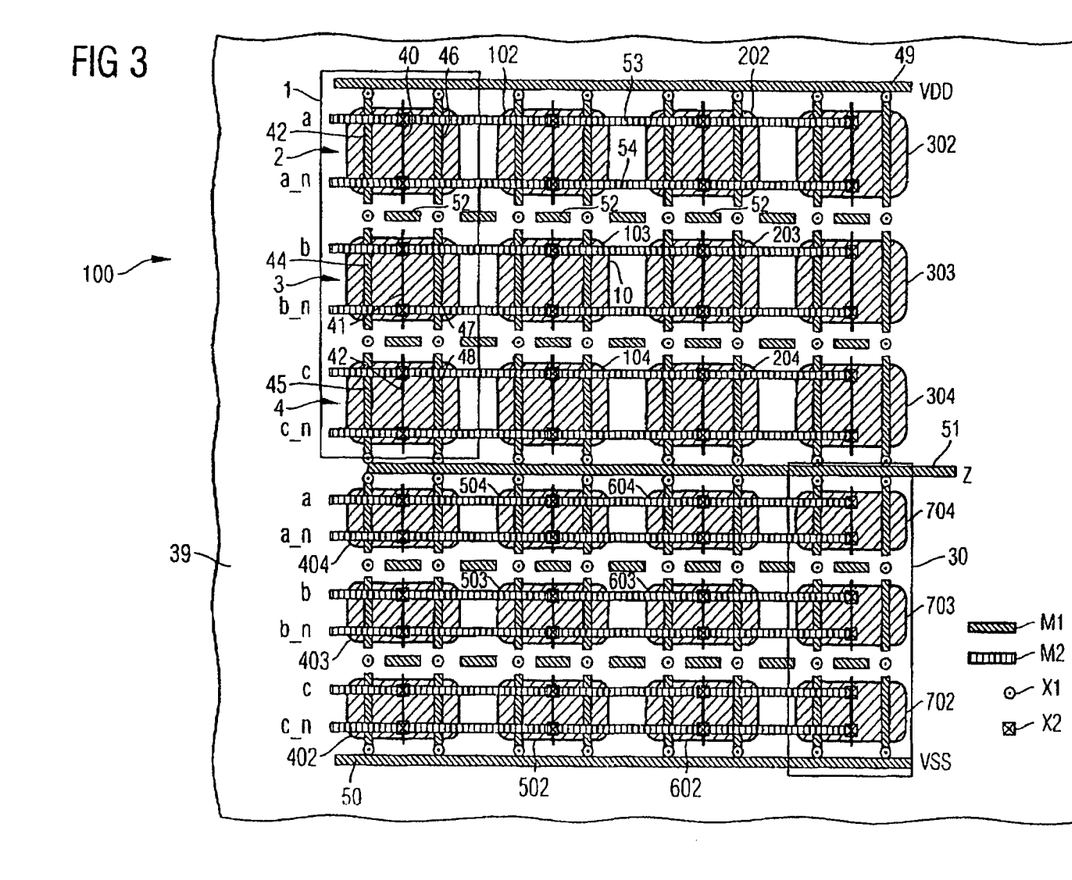
FIG. 3 is a preferred layout of an inventive logic macro.

FIG. 3 illustrates the non-programmed logic macro 100 in an exemplary layout. PMOS transistors 2, 3, 4 are formed on a semiconductor substrate 39, a first set 1—corresponding to the first set 1 in FIG. 2—of said transistors being described below by way of example. The transistors 2, 3, 4 each have a gate region 40, 41, 42 embodied from polysilicon.

A source region 43, 44, 45 and a drain region 46, 47, 48 are furthermore provided in each case. In principle, the designation drain region or source region depends on the interconnection of the corresponding regions with regard to the supply voltage potential. The transistors 2, 3, 4, 102, 103, 104, 202, 203, 204, 302, 303, 304 and also the corresponding complementary PMOS transistors 402, 403, 403, 502, 503, 504, 602, 603, 604, 702, 703, 704 are arranged in matrix-type fashion.

A first supply terminal strip 49 embodied from metal, a second supply terminal strip 50 and an output terminal strip 51 are provided in each case parallel to one another, the output terminal strip forming the output line 31.

The gate regions 40, 41, 42 of a set 1 of transistors 2, 3, 4 are arranged on a straight line, the source regions 43, 44, 45 are arranged on a straight line and the drain regions 46, 47, 48 are arranged essentially on a straight line.

The supply terminal strips 49, 50, the output terminal strip 51 and the strip-type drain and source regions 43, 44, 45, 46, 47 48 are preferably embodied in one process step in a metal M1 in a layer.

First metallization regions X1 are provided between the source regions 43, 44, 45 of the first set 1 of transistors 2, 3, 4, and also between the supply terminal strips 49 and the adjoining source and drain regions 43, 46. First metallization regions are also provided between the output terminal strip 51 and the adjoining source-drain regions 45, 48.

An electrical connection can be produced in a simple manner by metallizing individual metallization regions, for example the metallization region between the source region 43 and the supply strip 49 and also between the drain region 46 and the drain region 47 and between the drain region 47 and the drain region 48 and also between the drain region 48 and the output strip 51. The controllable path of the transistor 2 would thus be connected between the supply terminal strip 49 and the output terminal strip 51.

Furthermore, parallel to the supply terminal strips 49, 50 and the output terminal strip 51, connection webs 52 likewise made of the first metal M1 are provided between the metallization regions X1.

In order to make contact with the control terminals or gate regions 40, 41, 42, second metallization regions X2 are provided, which may be embodied as vertical vias, for example, over which, parallel to the output strip 51 and supply terminal strips 49, 50, input terminal strips 53, 54 are embodied in a second metal layer M2. By metallizing the second metallization regions X2 it is possible to define that one of the terminal strips 53, 54 to which the respective gate region 40 is intended to be coupled. Here, by way of example, the input signal a is passed to the first input terminal strip 53 and the complementary input signal a_n is passed to the second input terminal strip 54.

The respective first metallization regions X1 thus correspond to the switches 6, 8, 9, 106, 108, 109, 206, 208, 209, 306, 308, 309, 406, 408, 408, 506, 508, 509, 606, 608, 609, 706, 708, 709 illustrated in FIG. 2. The second metallization regions accordingly correspond to the switches 19, 20, 21, 119, 120, 121, 219, 220, 221, 319, 320, 321, 419, 420, 421, 519, 520, 521, 619, 620, 621, 719, 720, 721.

According to the invention, every possible switch position, as is indicated in FIG. 2, can be obtained by simple mask programming, that is to say definition of the metallization regions X1, X2 to be metallized. Consequently, the logic macro correspondingly embodied according to the invention can be configured or programmed by defining a single exposure mask which in turn defines the metallization of the metallization regions. The logic macro 100 illustrated here makes it possible to realize all 256 possible Boolean functions with three input variables.

The logic macro according to the invention therefore considerably simplifies the design complexity for logic circuits which are adapted in an application specific manner and are constructed from logic macros according to the invention. It is merely necessary to keep a logic macro 100 prefabricated according to the invention and to create programming masks for the respective Boolean functions desired.

Figure 4:
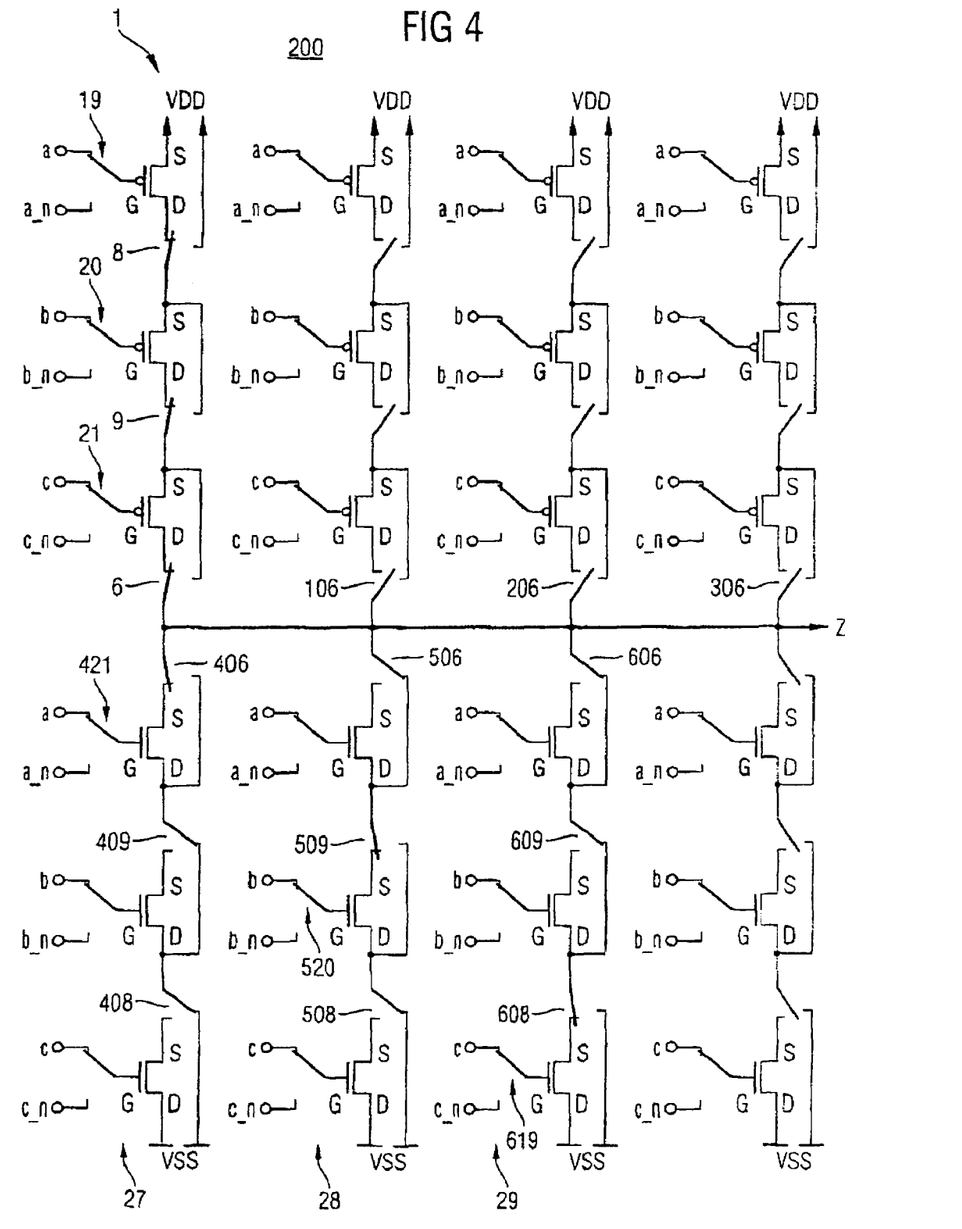
FIG. 4 is a circuit diagram of a logic macro programmed as a NAND gate.
Figure 4B:
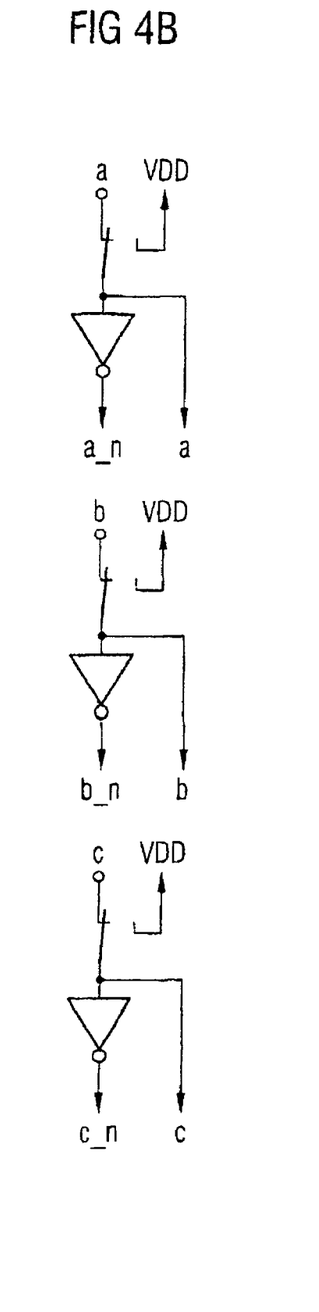

FIG. 4 illustrates an exemplary embodiment of a logic macro 200 according to the invention which is programmed as a NAND gate.

The realization of a corresponding NAND function requires merely the first set 1 of transistors and the first, second and third sets of complementary transistors. The interconnection is completely defined by programming the switches 6, 8, 9, 19, 20, 21, 406, 408, 409, 421, 506, 508, 509, 520, 606, 608, 609 and 619. The remaining switches are not used or the corresponding metallization regions in the layout are not metallized.

Figure 5:
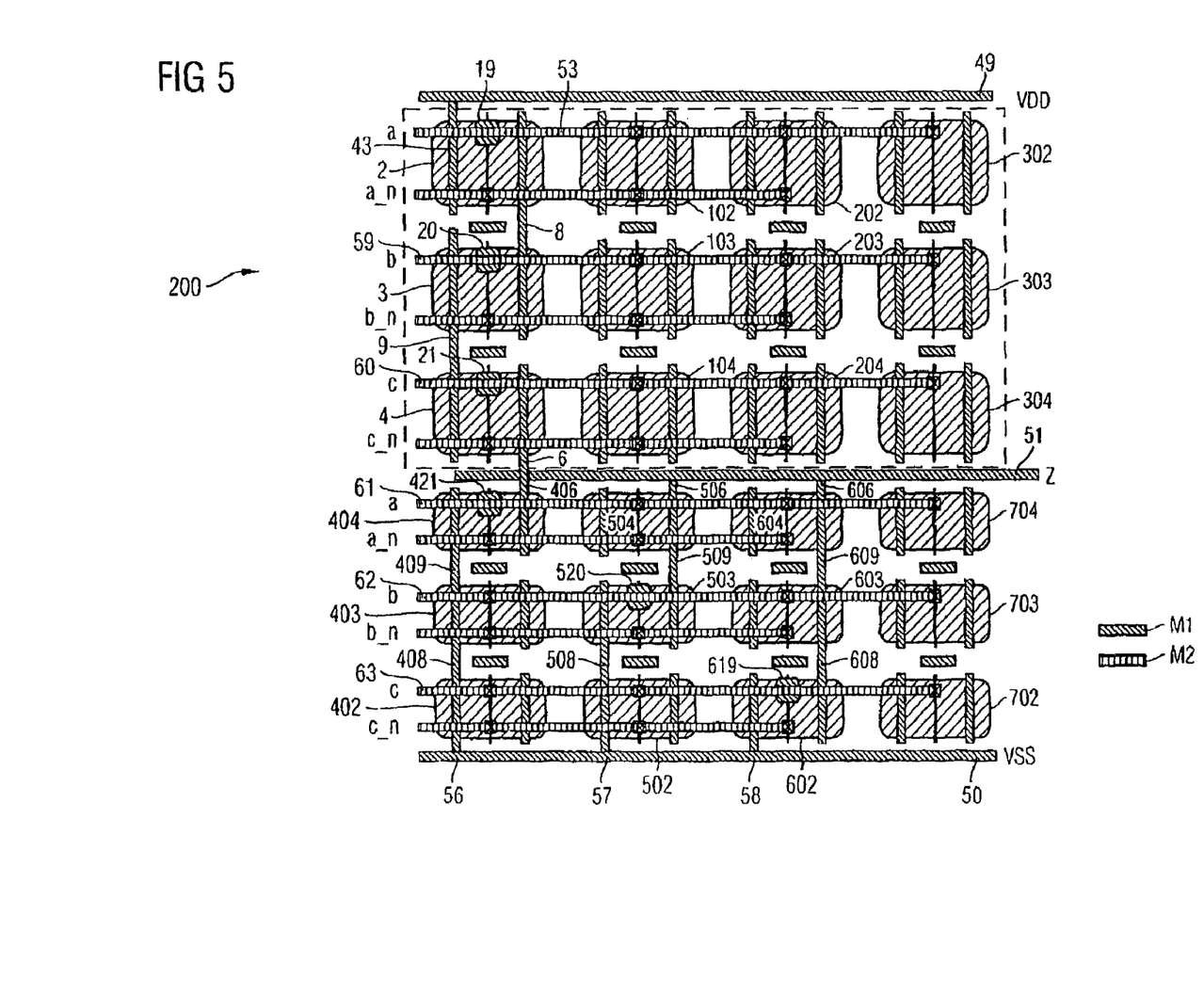
FIG. 5 is a programmed circuit as a NAND gate of the logic macro.

A logic gate programmed according to the NAND gate 200 as a layout is illustrated in FIG. 5. For this purpose, the metallization regions—corresponding to the switches—of the initially non-programmed logic macro, such as is designated as 100 for example in FIG. 3, have been metallized in a programming method step. In FIG. 5, the metallization locations which correspond to the switches and were utilized or metallized are now designated by the reference symbols for the corresponding switches from FIG. 4.

Furthermore, metallization locations 55, 56, 57, 58 are metallized in order to connect the source region 43 of the first transistor 2 to the supply terminal strip 49 and to connect the respective source regions of the transistors 402, 502, 602 to the second supply terminal strip 50.

Figure 6:
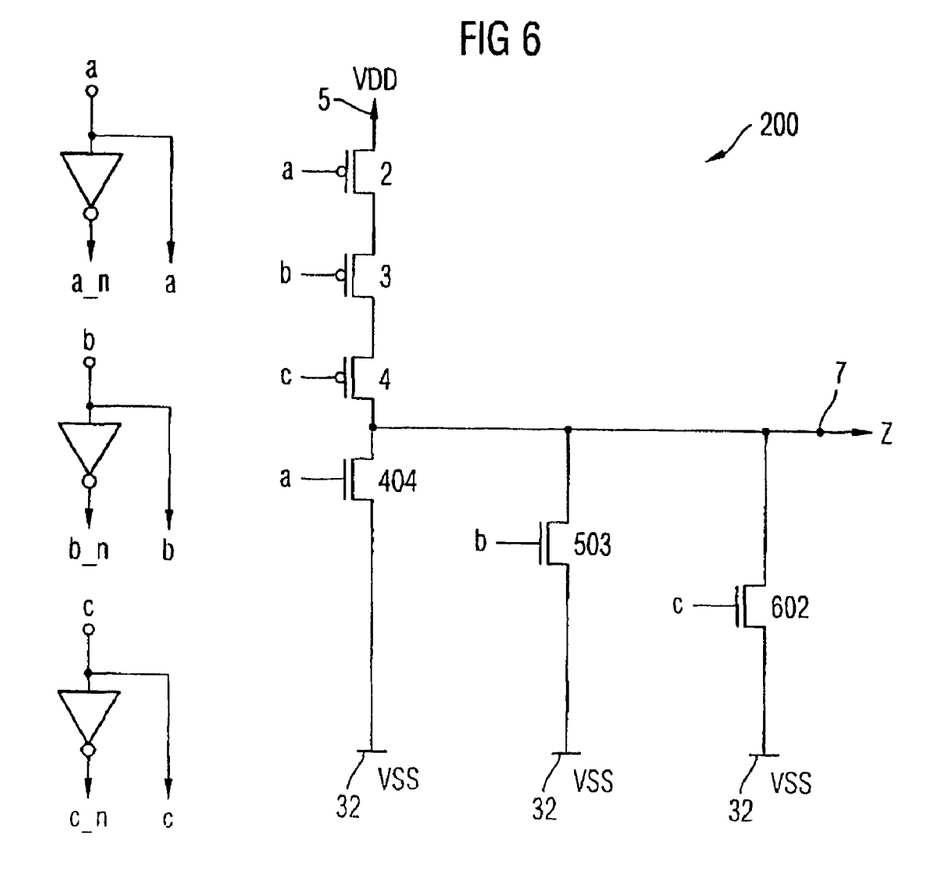
FIG. 6 is a programming layout of the logic macro programmed as a NAND gate.

The choice of the metallized metallization regions which are realized in the first metal layer M1 results in an interconnection of the transistors 2, 3, 4, 404, 503, 602 as is illustrated as a circuit in FIG. 6. The transistors 102, 103, 104, 202, 203, 204, 302, 303, 304, 402, 403, 502, 504, 603, 604, 702, 703, 704 are not used.

By way of example, the controllable path of the PMOS transistor 403 is bridged by the source region of the transistor 403 as a result of the switch position or metallization of the metallization regions 408, 409.

The input signals a, b, c, a_n, b_n, c_n are coupled to the corresponding gate regions via the parallel input terminal strips 53, 59, 60, 61, 62, 63 by means of the corresponding second metallization regions 19, 20, 21, 421, 520, and 619.

The desired Boolean function is therefore defined merely in one masking step or one production process step by using a mask for metallizing the metallization regions 6, 8, 9, 19, 55, 56, 57, 58, 406, 408, 409, 421, 506, 508, 509, 520, 606, 608, 609, 619 used here.

The circuit thus realized is illustrated in simplified fashion in FIG. 6. The controllable paths of the first, second and third PMOS transistors 2, 3, 4 are connected in series between the supply terminal 5 and the output terminal 7, an input signal a being fed to the control terminal of the PMOS transistor, the input signal b being fed to the control terminal of the second PMOS transistor 3 and the input signal c being fed to the control terminal of the third transistor 4.

The third NMOS transistor 404 of the first set 27 of complementary transistors is connected between the second supply terminal 32 and the output terminal 7, the input signal a being fed to the control terminal of the third complementary NMOS transistor 404.

The second NMOS transistor 503 of the second complementary set 28 of transistors is connected by its controllable path between the output terminal 7 and the second supply terminal 32, the input signal B being fed to the control terminal.

The controllable path of the first NMOS transistor 602 of the third set 29 of complementary transistors is connected between the output terminal 7 and the second supply terminal 32, the input signal c being fed to the control terminal.

This interconnection 200 programmed according to the invention results in a Boolean NAND function for the three input signals a, b, c. If, by way of example, a combination of input signals a=0, b=0, c=0 is present, an output signal Z=1 s output. For all other combinations of input signal levels, the output signal is Z–0.

Figure 7:
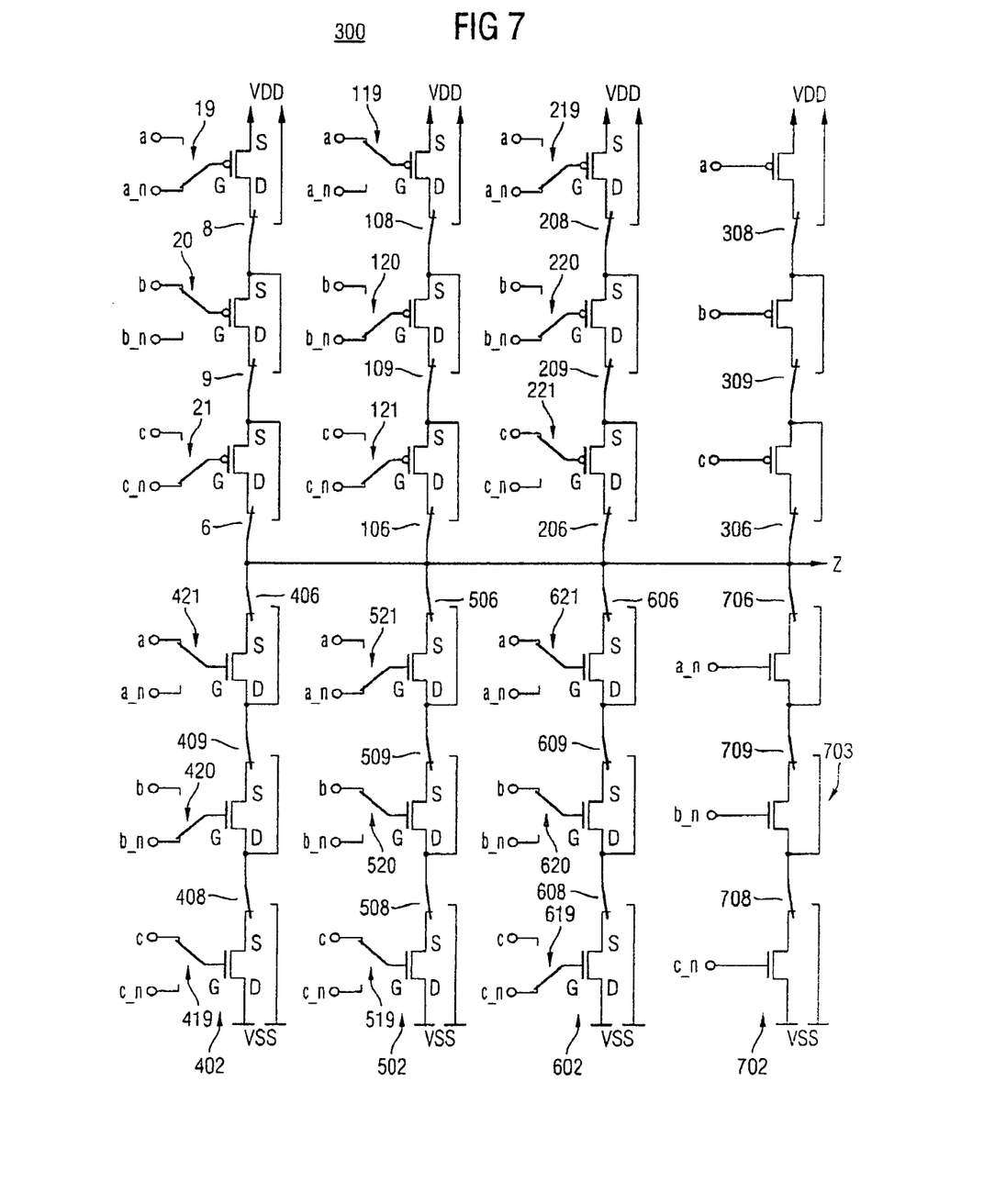
FIG. 7 is a circuit diagram of the logic macro programmed as an NXOR gate.
Figure 7B:
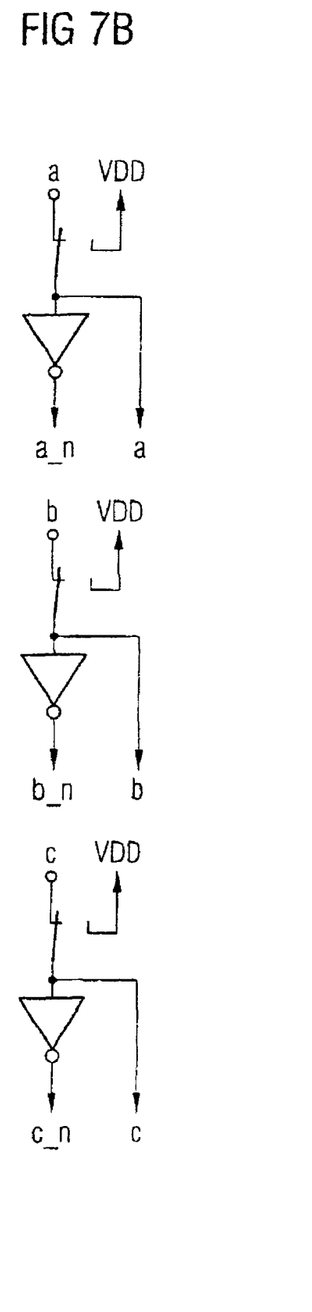

A further programming example for the logic macro according to the invention is specified in FIG. 7.

Figure 8:
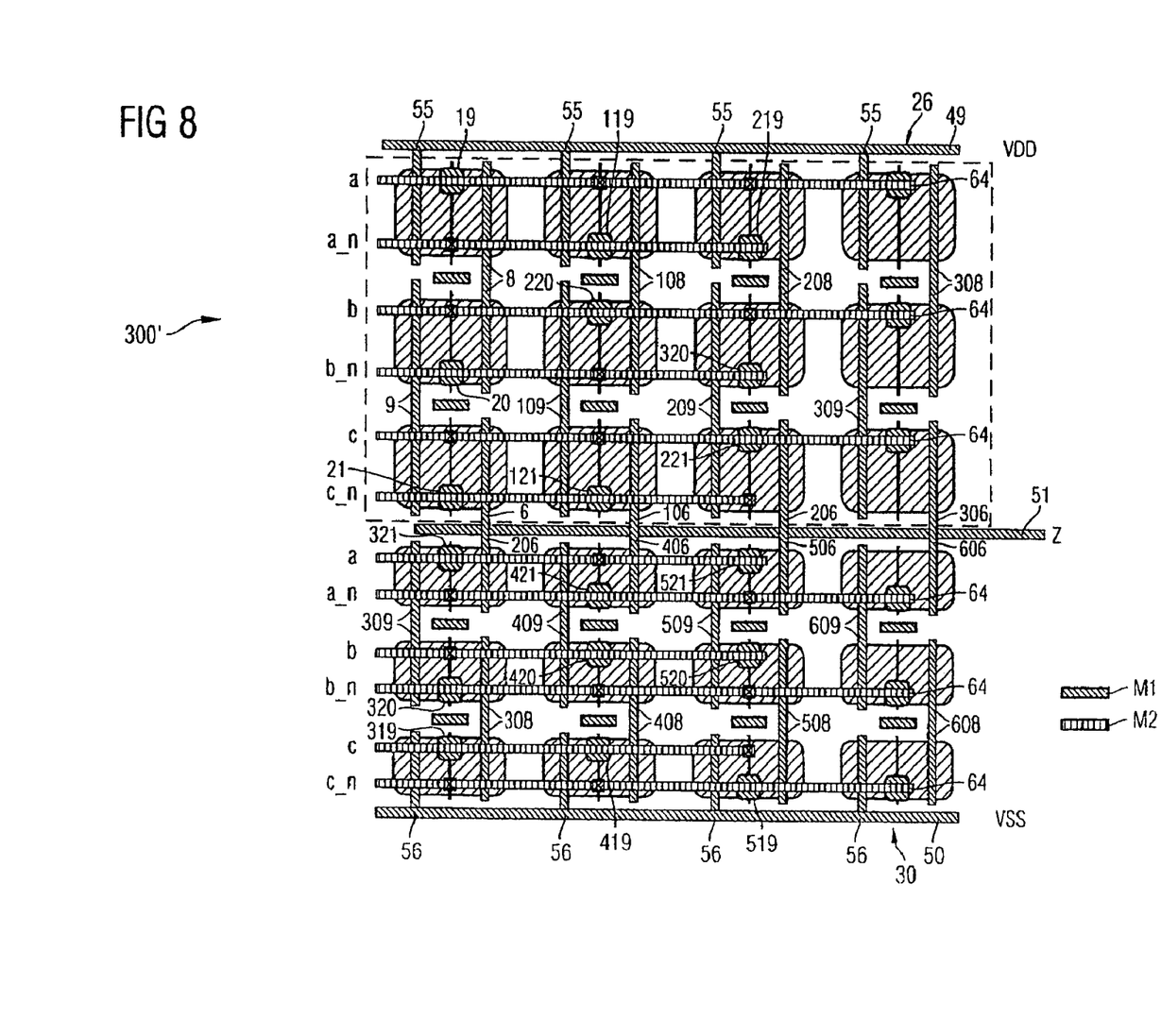
FIG. 8 is a layout of the logic macro programmed as an NXOR gate.

An NXOR gate is realized in the schematic circuit 300 in accordance with FIG. 7. All the sets of transistors have to be used for realizing the NXOR function. The switches that are correspondingly to be set or programmed by means of metallization are labeled in FIG. 7. The same reference symbols are illustrated in FIG. 8 for the correspondingly metallized metallization regions in a layout 300'. The metallization regions 55, 56 for connecting the supply terminal strips 49, 50 to the corresponding transistors are provided in addition to the mask-programmed switch positions.

The variant of the layout 300 illustrated here involves fixedly implementing the second metallization regions 64 for making contact with the corresponding gate regions in the fourth transistor set 26 and the fourth complementary transistor set 30. The programmable logic macro may furthermore have the inverter arrangements for generating the inverse input signals a_n, b_n, c_n as illustrated in FIG. 7. FIGS. 7 and 8 illustrate a logic macro programmed as an NXOR gate. The input signal combination abc=001, 010, 100 and 111 bring about an output signal Z=0 and the input combination abc=000, 110, 101, 001 bring about a logic 1 at the output terminal.

Although the present invention has been explained on the basis of particular exemplary embodiments, it is not restricted thereto, but rather can be modified in any desired manner without departing from the basic principle of the invention.

In particular, the layout for a mask-programmable logic macro according to the invention need not necessarily have the geometry and topology as illustrated in FIGS. 3, 5 and 8.

Although the exemplary embodiments realize Boolean functions with three inputs, the invention can be extended as desired, for example to four input signals, by providing sets of transistors having more than three transistors arranged according to the invention. In order to process four input signals in any desired Boolean fashion, it is necessary for example to embody a transistor matrix comprising four transistor sets each having four transistors, and the same number of complementary transistors. 32 transistors would thus be obtained for the realization of four input-signal-dependent Boolean functions.

In order to realize Boolean functions with more than three input variables, it is also possible to multiplex a plurality of programmed logic macros according to the invention or function generators at three inputs. It is then possible to use the input signals a, b, c for logic macros connected in parallel, a fourth input signal controlling a multiplexer which changes over between the output signals of the two logic macros.

If specific selected Boolean functions do not necessarily have to be realized, the corresponding layout for the logic macro according to the invention can be simplified further. If, by way of example, the XOR function can be dispensed with, it is possible, the illustrated in FIG. 8, to connect the sets 26 and 30 of transistors in each case fixedly to the input signals a, b, c and noninverted input signals a_n, b_n, c_n respectively.

It is furthermore possible to save some of the transistors by means of a favorable interconnection. It is possible, for example, in FIGS. 7 and 8, to produce a horizontal connection between the drain terminal D of the transistor 402 and the source terminal S of the transistor 503 and also between the drain terminal of the transistor 602 and the source terminal of the transistor 703. The transistors 502 and 702 could thus be saved. Analogous simplifying circuits are possible in the case of further transistors.

What is claimed is:

1. A mask-programmable logic macro, comprising:
   at least three input terminals;
   an output terminal; and
   a first set of transistors comprised of at least three transistors formed on a semiconductor substrate, each of the transistors comprising a controllable path and a control terminal;
   wherein the controllable paths can be connected in series with one another between a first supply terminal and the output terminal by metallizing first metallization regions;
   wherein the transistors of the first set of transistors are arranged on the semiconductor substrate in such a way that at least one controllable path of the transistors can be bridged by metallizing one of the first metallization regions; and
   wherein a respective of the input terminals can be connected to a respective of the control terminals by metallizing a second metallization region.

2. The logic macro of claim 1, comprising at least one further set of transistors; the further set of transistors being connected in parallel with the transistors of the first set of transistors between the first supply terminal and the output terminal.

3. The logic macro of claim 2, comprising at least one first complementary set of transistors connected between a second supply terminal and the output terminal.

4. The logic macro of claim 1, comprising four first sets of transistors, each comprising three transistors, and four second sets of transistors, each comprising three complementary transistors, for realizing a Boolean function; the three signals present at the input terminals being subjected to the respective Boolean function and a function result being output as an output signal.

5. The logic macro of claim 4, wherein a respective Boolean function is defined by metallizing at least one of the first or second metallization regions.

6. The logic macro of claim 1, wherein each of the transistors comprises in top view a rectangular doped transistor region on the semiconductor substrate with, formed thereon, a strip-type source region, gate region, and drain region; wherein the source, gate, and drain regions are running essentially perpendicular to an output terminal strip formed on the semiconductor substrate and wherein at least one of a source or drain region of adjacent transistors can be connected to one another by the metallizing of the first metallization regions.

7. The logic macro of claim 6, wherein the source, gate, and drain regions of transistors of the sets of transistors are arranged essentially on a straight line and can be connected to one another by metallizing at least one of the first or second metallization regions.

8. The logic macro of claim 6, wherein input terminal strips parallel to one another are provided essentially perpendicular to the gate regions; wherein the gate regions are connected to the input terminal strips by metallizing the second metallization regions.

9. The logic macro of claim 7, wherein input terminal strips parallel to one another are provided essentially perpendicular to the gate regions; wherein the gate regions are connected to the input terminal strips by metallizing the second metallization regions.

10. The logic macro of claim 8, wherein at least one of the input terminal strips, the output terminal strip, or the source, gate and drain regions comprise at least in part a metallic material or a material comprising metal.

11. The logic macro of claim 6, wherein the gate regions comprise polysilicon.

12. The logic macro of claim 1, wherein the transistors are MOSFET transistors.

13. The logic macro of claim 1, wherein the transistors are arranged in matrix-type fashion in a transistor matrix.

14. A method for programming a logic macro, comprising the steps of:
providing a prefabricated logic macro, which comprises at least three transistors formed on a semiconductor substrate, at least one supply terminal strip, and an output terminal strip; the transistors each comprising source, gate, and drain regions arranged in such a way that
a respective controllable path of the relevant transistor lying below a gate region can be bridged by a source or drain region by means of metallizing first metallization regions or
at least one source region of one of the transistors together with a drain region of another of the transistors can be connected to one another by means of metallizing the first metallization region;
metallizing first metallization regions on the semiconductor substrate by means of a programming mask in such a way that
one of the controllable paths is either connected in series with a another of the controllable paths or
is bridged by a respective source or drain region and
at least one source region is connected to the supply terminal strip and at least one drain region is connected to the output terminal strip;
metallizing second metallization regions on the gate regions of the transistors; and
forming at least three input terminal strips on the second metallized metallization regions.

15. The method of claim 14, wherein the supply terminal strip, the output terminal strip and the first metallized metallization regions are formed in the same processing layer on the prefabricated logic macro.

16. The method of claim 14, wherein the transistors are produced in a CMOS process.

17. A method, comprising:
providing a programmable device with at least three input terminals, an output terminal, a first set of transistors comprised of at least three transistors formed on a semiconductor substrate, each of the transistors comprising a controllable path and a control terminal, wherein the controllable paths can be connected in series with one another between a first supply terminal and the output terminal by metallizing first metallization regions;
selectively performing at least one from a set of available options including,
bridging at least one controllable path of the transistors by metallizing one of the first metallization regions; and
connecting a respective of the input terminals to a respective control terminal by metallizing a second metallization region.

18. The method of claim 17, wherein the step of providing a programmable device includes providing a logic macro as the programmable device.

19. The method of claim 17, wherein the step of providing a programmable device includes providing a programmable device wherein the transistors are MOSFET transistors.

20. method of claim 17, wherein the step of providing a programmable device includes providing a programmable device wherein the transistors are arranged in matrix-type fashion in a transistor matrix.

* * * * *